(12) United States Patent
Heijna

(10) Patent No.: US 7,711,071 B2
(45) Date of Patent: May 4, 2010

(54) SETTING THE SLICE LEVEL IN A BINARY SIGNAL

(75) Inventor: Roeland John Heijna, Nijmegen (NL)

(73) Assignee: NXP B.V., Eindhoven (NL)

( * ) Notice: Subject to any disclaimer, the term of this patent is extended or adjusted under 35 U.S.C. 154(b) by 1370 days.

(21) Appl. No.: 10/522,470

(22) PCT Filed: Jun. 27, 2003

(86) PCT No.: PCT/IB03/02934

§ 371 (c)(1), (2), (4) Date: Jan. 26, 2005

(87) PCT Pub. No.: WO2004/014066

PCT Pub. Date: Feb. 12, 2004

(65) Prior Publication Data

US 2006/0152626 A1    Jul. 13, 2006

(30) Foreign Application Priority Data

Jul. 31, 2002    (EP) .................................. 02078148

(51) Int. Cl.
    *H04L 25/06* (2006.01)
(52) U.S. Cl. ........................... 375/317; 327/72
(58) Field of Classification Search ................. 375/317, 375/318; 329/349, 350, 353; 327/72
    See application file for complete search history.

(56) References Cited

U.S. PATENT DOCUMENTS

| 4,651,105 | A | * | 3/1987 | Inbar ............................. 327/58 |
| 4,666,046 | A | * | 5/1987 | Manzer ......................... 209/599 |
| 4,707,740 | A | * | 11/1987 | Stratton ........................ 348/532 |
| 5,091,920 | A | * | 2/1992 | Ikeda et al. ................... 375/317 |
| 5,101,395 | A | | 3/1992 | Cardero et al. |
| 5,130,543 | A | * | 7/1992 | Bradbeer ...................... 250/342 |
| 5,210,712 | A | | 5/1993 | Saito |
| 5,373,400 | A | | 12/1994 | Kovacs |
| 6,041,084 | A | * | 3/2000 | Nagaraj ......................... 375/317 |
| 6,151,150 | A | | 11/2000 | Kikuchi |
| 6,160,434 | A | | 12/2000 | Yoshimura et al. |
| 6,377,633 | B1 | * | 4/2002 | Schneider .................... 375/317 |
| 6,414,528 | B1 | | 7/2002 | Usui |
| 6,535,039 | B2 | | 3/2003 | Nanba et al. |
| 6,657,488 | B1 | * | 12/2003 | King et al. ...................... 330/9 |
| 2003/0081697 | A1 | * | 5/2003 | Little ............................ 375/317 |

FOREIGN PATENT DOCUMENTS

| EP | 0 889 590 A1 | 1/1999 |
| JP | 62-237808 A | 10/1987 |
| JP | 2-21720 A | 1/1990 |
| JP | 5-7135 A | 1/1993 |
| JP | 5-90918 A | 12/1993 |
| JP | 2000-36729 A | 2/2000 |
| JP | 2002-164770 A | 6/2002 |
| WO | 00/65717 A1 | 11/2000 |

* cited by examiner

*Primary Examiner*—Shuwang Liu
*Assistant Examiner*—David Huang

(57) ABSTRACT

A method of setting the slice level (SL) in a binary signal (T) comprises measuring the noise level at both signal levels (A,B) and adjusting (Z) the slice levels in dependence upon the measured noise levels. By weighing the noise levels, asymmetric noise is taken into account. A device (10) for setting the slice level comprises level shift means and noise peak level detection means.

14 Claims, 3 Drawing Sheets

SETTING THE SLICE LEVEL IN A BINARY SIGNAL

Figure 1:
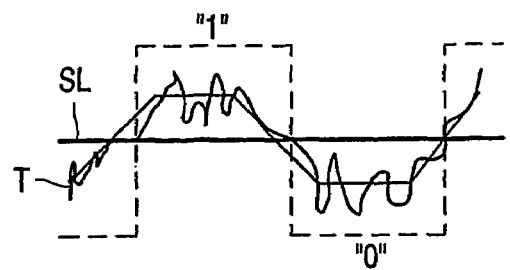

The present invention relates to a method and device for setting the slice level in a binary signal.

The two signal levels of a binary signal are usually referred to as "high" and "low" and may represent a logical "1" and "0" respectively. The "high" level may correspond to a signal level of, for example, +5V while the "low" level may correspond to a signal level of, for example, −5V or ground. When recovering a transmitted binary signal it has to be decided which signal portions are high and which are low. To this end, a threshold is usually set approximately halfway between the high and the low signal levels. Any signal level exceeding this threshold or "slice level" is considered to represent a high level, other signal levels are categorized as low.

In the presence of noise it is possible that errors are introduced. Noise peaks present in the low level signal portions may exceed the slice level so as to incorrectly cause a high level to be detected. The prior art offers only a partial solution to this problem.

U.S. Pat. No. 4,707,740 discloses a sync detector for recovering a sync signal from a video signal. A slice level signal is adjusted during a low level ("sync tip") portion of the video signal. To this end, a noise detector provides an output representative of the average noise during this low level signal portion. This noise detector output is used to generate a positive slice level offset during the low level signal portions and a negative offset of the same magnitude during the high level signal portions.

This prior art solution has several disadvantages. The slice level adjustment is discontinuous, thus compounding any detection errors. In addition, the adjustment is based on the noise level in the low level signal portions only. As the noise level increases, the slice level will be pushed up indiscriminately towards the high signal level and may even reach the high signal level, which is clearly undesirable. Moreover, the positive and negative offset of equal magnitude assume a symmetrical noise distribution, that is, the noise peaks in the high level signal and in the low level signal having (on average) the same magnitude. However, there are many applications in which the noise has an asymmetrical distribution, the noise peaks in one signal level having (on average) a different magnitude to those in the other signal level. An example of such an application is optical communication links.

It is therefore an object of the present invention to solve the problems of the prior art and to provide a method for setting the slice level in a binary signal which takes the noise level in both the low level and the high level signal portions into account.

It is another object of the present invention to provide a method for setting the slice level in a binary signal which appropriately deals with asymmetric noise distributions.

It is a further object of the present invention to provide a device for carrying out the method of the present invention, and a receiver provided with such a device.

The invention is defined by the independent claims. The dependent claims define advantageous embodiments.

By measuring the noise level during the second signal portion as well as during the first, it is possible to take both noise levels into account when adjusting the slice level, thus achieving a more balanced adjustment. By applying a continuous slice level adjustment in both the first and the second signal portions, the detrimental effects of any erroneous discontinuous adjustments are avoided.

In a preferred embodiment, the slice level is set at a value substantially equal to half the difference between the magnitudes of the first and the second signal levels minus half the difference between the magnitudes of the first and the second noise levels. That is, the slice level is preferably initially set halfway between the signal levels, the adjustment being equal to half the difference in the noise levels. It will be clear that if the signal levels are equal in magnitude but of opposite signs, their difference will be equal to zero. Similarly, if the noise levels are equal in magnitude, no adjustment will be made. However, if the noise levels are not equal in magnitude (asymmetrical noise), the slice level is adjusted accordingly, resulting in fewer detection errors.

It is preferred that measuring the respective noise levels involves detecting peaks in the binary signal. By using peak detection, a good indication of the noise levels can be easily achieved.

The present invention also provides device for detecting the noise level in a binary signal, comprising a noise peak level detection means for receiving input signals and producing a noise indication signal, characterized in that the noise peak level detection means comprise an RMS level detector for detecting the RMS level of the binary signal, a first differential amplifier for amplifying the difference of the first level of the binary signal and the RMS level to supply a first level compensated noise signal to the first peak detector, a second differential amplifier for amplifying the difference of the second level of the binary signal and the RMS level to produce a second level compensated noise signal to the second peak detector. A noise level detector of this kind has the advantage that it can detect very small noise peaks (smaller than 50 mV) which Prior art noise detectors often fail to detect.

Figure 2:
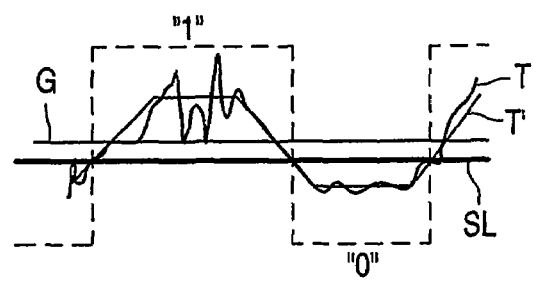
Figure 3:
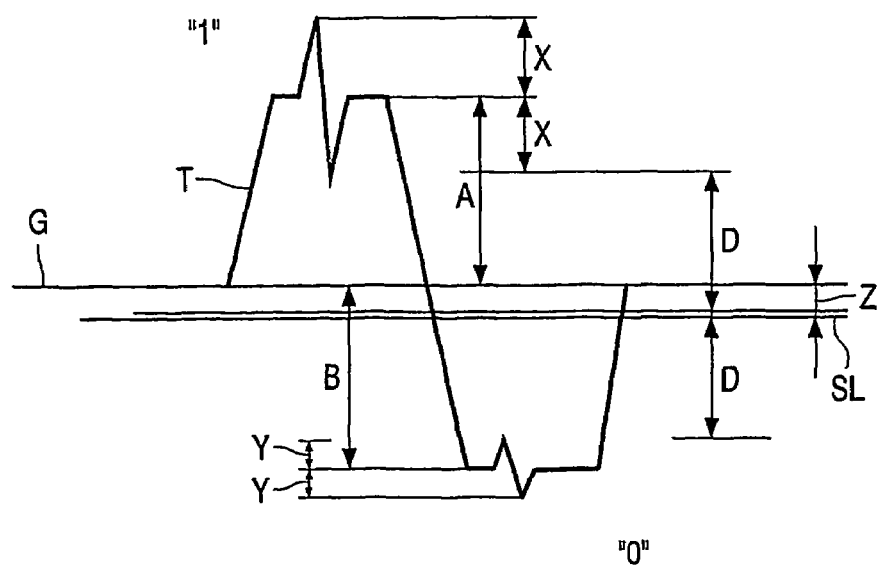
Figure 4:
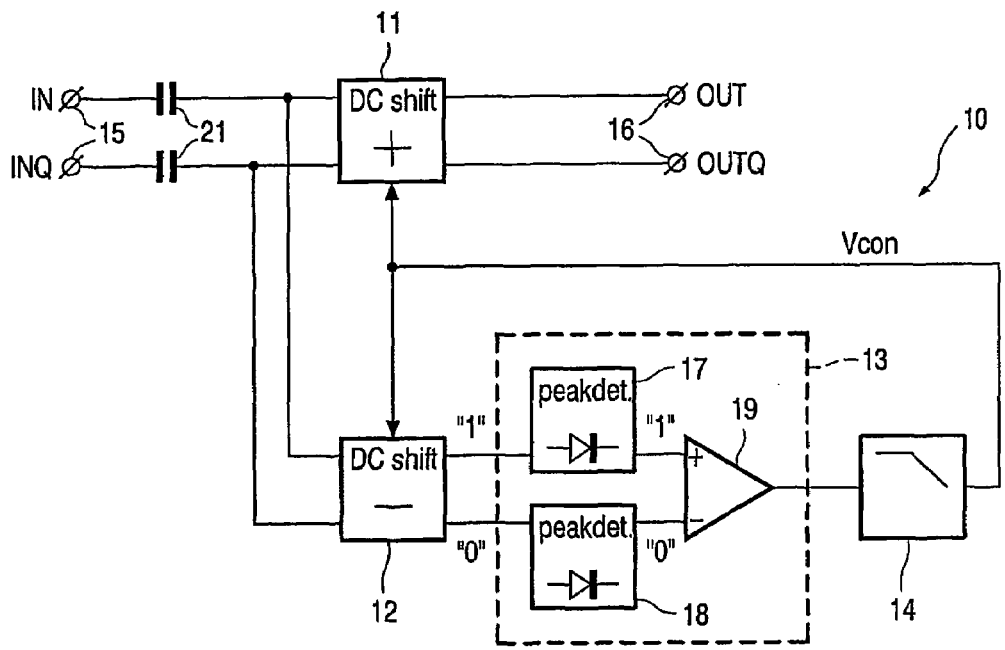
Figure 5:
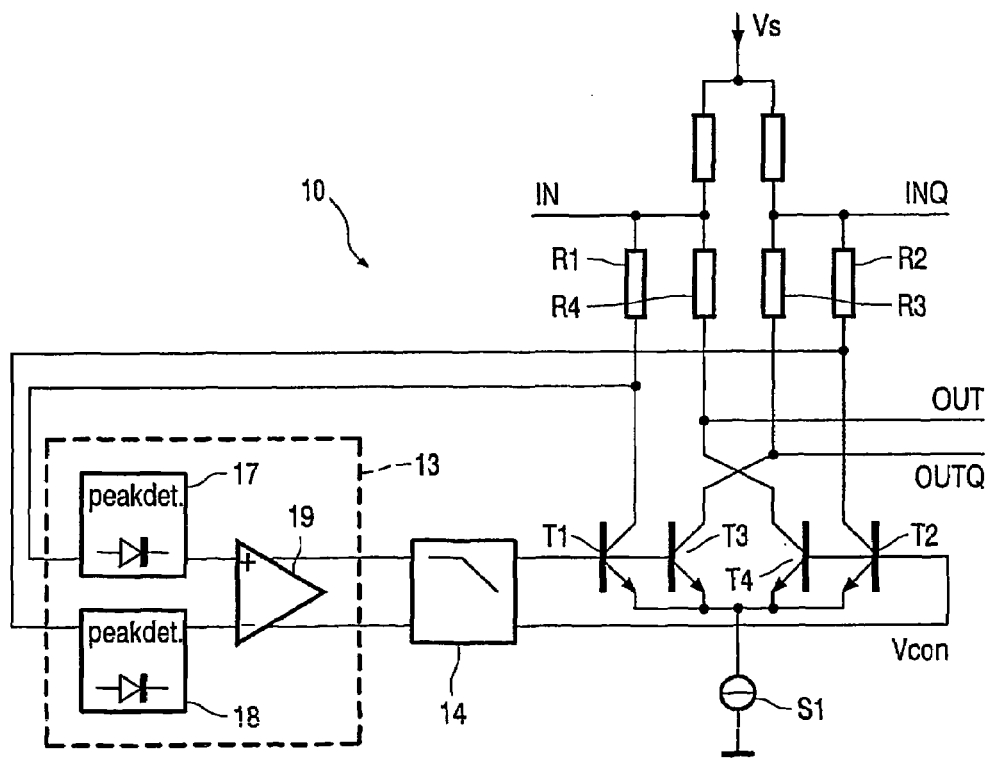
Figure 6:
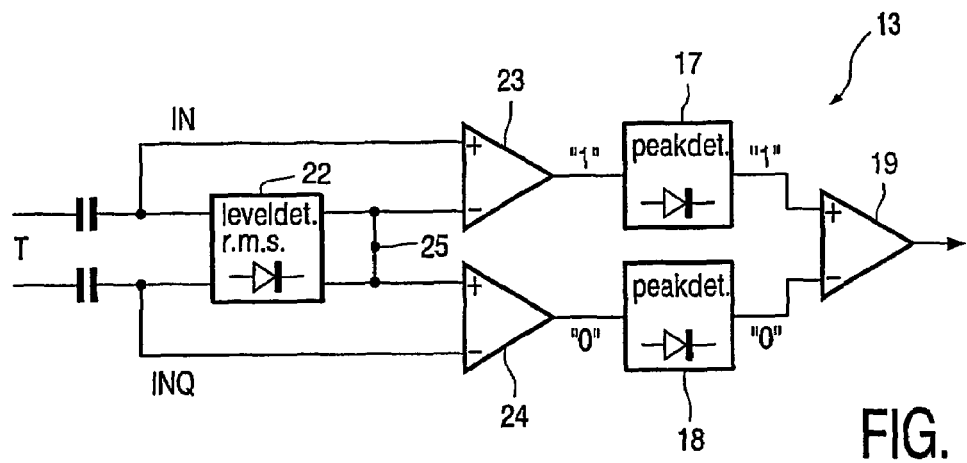
Figure 7:
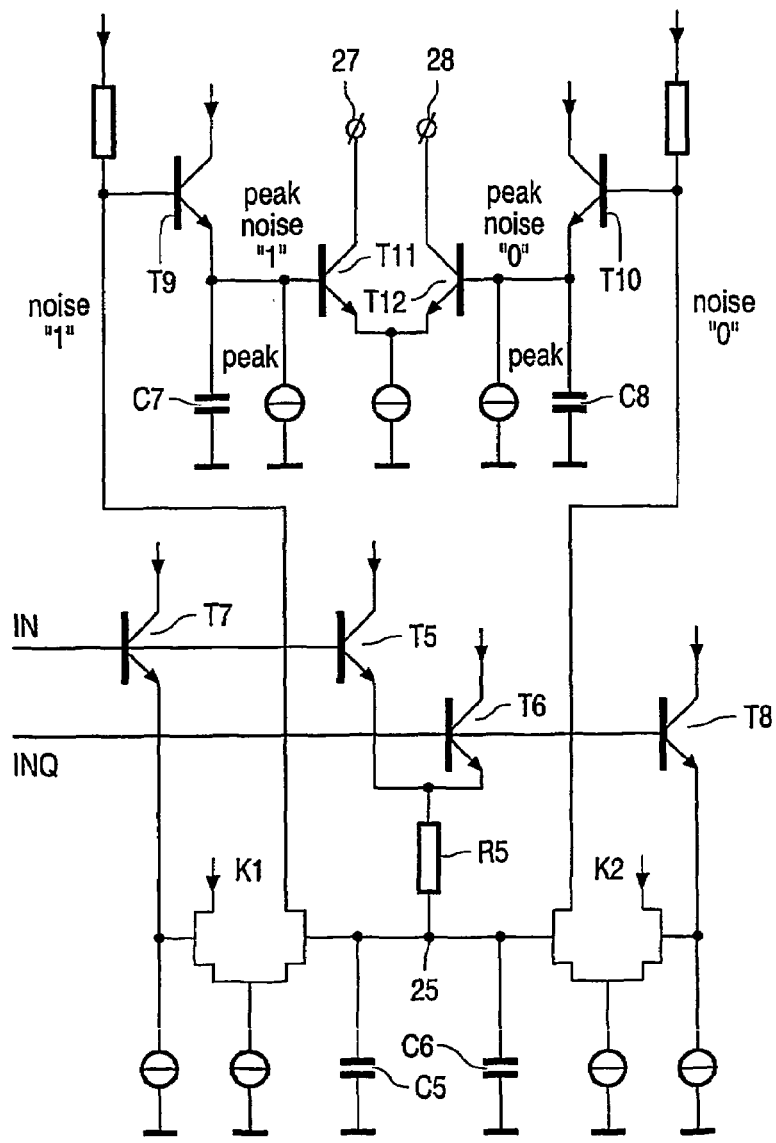

The present invention will be further explained below with reference to exemplary embodiments illustrated in the accompanying drawings, in which:

FIG. 1 schematically shows a binary signal containing symmetrical noise;

FIG. 2 schematically shows a binary signal containing symmetrical noise;

FIG. 3 schematically shows the signal of FIG. 2 in more detail;

FIG. 4 schematically shows a device for setting the slice level according to the present invention;

FIG. 5 schematically shows an embodiment of the device of FIG. 4;

FIG. 6 schematically shows a peak detection arrangement according to the present invention; and FIG. 7 schematically shows an embodiment of the device of FIG. 6.

The binary signal T shown in FIG. 1 has two signals levels, one representing a logical "1" and another representing a logical "0". Both signal levels are corrupted by noise to a similar extent. Upon reception of this signal it has to be decided which signal level was transmitted. To this end a threshold or slice level SL is set approximately halfway between the average positive and the average negative signal level, as shown in FIG. 1. The logical value "1" (or signal level "high") is assigned to those portions of the signal exceeding the slice level SL, while the logical value "0" (or signal level "low") is assigned to the remaining signal portions. The resulting waveform is shown as a dotted line and is called the detected signal.

Setting the slice level halfway between the average positive and the average negative signal level, which corresponds to signal level "ground" in FIG. 1, minimizes the number of (detection) errors caused by noise peaks crossing the slice level. In this way, the maximum distance between the slice level and the noise peaks is achieved, assuming that the noise peaks of both signal levels have about the same magnitudes. In the signal T of FIG. 2, however, the noise peaks during the high signal periods have a much bigger magnitude than the noise peaks during the low signal periods. In accordance with the present invention, the slice level SL is now adjusted to maintain the maximum distance between the slice level and the noise peaks, resulting in fewer detection errors. As shown in FIG. 2, the slice level SL is in this particular case set at a level lower than ground level G, thus reducing the probability of detection errors due to noise peaks in the high signal portions while maintaining a sufficiently low probability of detection errors during the low signal portions.

The signal T shown in FIG. 3 is a stylized version of the signal of FIG. 2. The signal T has a high ("1") signal level with a amplitude A and a low ("0") signal level with an amplitude B. Normally the amplitudes A and B will be equal but of opposite signs relative to a common signal level G (for example ground). The high signal portions have noise peaks with an amplitude X, while the noise peaks during the low signal portions are shown to have a smaller amplitude Y (it will be understood that it is also possible for the low signal level to have the biggest noise peaks).

In accordance with the present invention the slice level SL is set so as to maximize the distance between the slice level and the noise peaks. When the slice level SL is set at the common signal level G, the distance between the noise peaks X and the slice level SL is smaller than the distance between the noise peaks Y and the slice level. As a consequence, there is an unnecessary large probability that a noise peak X will cross the slice level, resulting in a detection error. However, when the slice level SL is set as shown in FIG. 3 to be below the common signal level G by an offset Z, the noise peaks X and Y are at equal distances. In mathematical terms this means that:

$$D = A - X + Z = B - Y - Z$$

from which it follows that:

$$Z = \tfrac{1}{2}(B-A) + \tfrac{1}{2}(X-Y).$$

When the signal magnitudes are equal (A=B) it follows that:

$$Z = \tfrac{1}{2}(X-Y).$$

In other words, when the signal magnitudes are equal, the offset Z is equal to half the difference in noise (peak) magnitudes. In the case of symmetrical noise (X=Y) this means that the offset is equal to zero, as before.

A device for setting the slice level in accordance with the present invention is depicted in block diagram form in FIG. 4. The device 10 comprises a first level shifter 11 and a second level shifter 12 which are connected in parallel to input terminals 15 via optional decoupling capacitors 21. The input terminals 15 receive the signal T of FIG. 3 having signal components IN and INQ relative to ground. In the second level shifter 12, a DC level is subtracted from the signal components IN and INQ so as to compensate the difference in noise levels before a peak detection is carried out. The magnitudes of these signal components after this level shift are IN"=IN−Vcon and INQ"=INQ+Vcon respectively. The level shifted signal components are then passed to a peak detection unit 13 which comprises a first peak detector 17, a second peak detector 18 and a differential amplifier 19. The first peak detector 17 detects the peaks in the compensated (high level) signal IN", while the second peak detector 18 detects the peaks in the corresponding signal INQ". The output signals of the peak detectors 17, 18 are received by the differential amplifier 19 so as to produce the noise indication signal Vcon which represents the difference in noise peak levels. In preferred embodiments this signal Vcon is filtered using a low-pass filter 14 so as to remove any high frequency noise. It will be clear from the above description that in case of symmetrical noise the signal Vcon will be substantially equal to zero.

The noise indication signal Vcon is passed on to both the first level shifter 11 and the second level shifter 12. In the latter, this signal is used to subtract a DC level from the input signal components IN and INQ as described above, said DC level being equal to Vcon. In the first level shifter 11 the signal Vcon is used to add a DC level equal to Vcon to the input signal components IN and INQ resulting in output signal components IN' and INQ' at the output terminals 16 having magnitudes of IN'=IN+Vcon and INQ'=INQ−Vcon respectively. This is the signal T having the offset slice level shown in FIG. 3.

As can be seen, the adjustment of the slice level using the noise indication signal Vcon is continuous. When the noise characteristics change, the slice level is adjusted accordingly. Even a change in the type of noise, e.g. from asymmetrical to symmetrical, is taken into account. The detected signal is not used to set the slice level, thus avoiding the possibility of compounding detection errors.

An advantageous embodiment of the device of FIG. 4 is shown in FIG. 5. The peak detection unit 13 and the low-pass filter 14 can be readily identified. In contrast to FIG. 4, the differential amplifier 19 of FIG. 5 is shown to produce both the signal Vcon and an inverted signal —Vcon, both of which are filtered by the filter 14. The first and second level shifters 11 and 12 are constituted by the transistor pairs T1, T2 and T3, T4 respectively which are all connected to a current source S1. Each transistor pair constitutes a differential amplifier. The signals Vcon and —Vcon cause current to flow through the respective transistors, leading to voltage drops (that is, level shifts) in the corresponding resistors R1, R2, R3 and R4 respectively.

In FIG. 6 a particularly advantageous peak detection unit 13 is shown. Most peak detectors have the disadvantage that they only detect signals exceeding approximately 50 mV, which will obviously leave small noise peaks undetected. The peak detection unit of FIG. 6 solves this problem by detecting the value of the noise relative to the RMS (root mean square) value of the signal in which the noise is present. That is, not the absolute but the relative noise value is detected. To this end, an RMS level detector 22 is provided which outputs the RMS at 25. A first differential amplifier 23 amplifies the difference of the signal component IN and the RMS of the input signal T while a second differential amplifier 24 amplifies the difference of the signal component INQ and the RMS. These amplified differences are then fed to the peak detectors 17 and 18. In this way, even small noise peaks can be detected. The peak detection unit 13 of FIG. 6 can also be used independently of the slice level detection described above.

A particularly advantageous embodiment of the peak detection unit 13 is illustrated in FIG. 7. Transistors T5, T6 in conjunction with resistor R5 and capacitors C5, C6 constitute the RMS level detector 22 of FIG. 6, producing the RMS level value at 25. Differential amplifier K1 and transistor T7 form the amplifier 23 of FIG. 6, while their counterparts K2 and T8 correspond with amplifier 24. Transistor T9 in conjunction with capacitor C7 on the one hand and transistor T10 and capacitor C8 on the other hand constitute peak detectors 17 and 18 respectively, the transistor pair T11, T12 forming the differential amplifier 19. The noise indication signals Vcon,—Vcon (see FIG. 5) appear at terminals 27, 28.

It will be understood by those skilled in the art that many modifications and additions may be made without departing from the scope of the invention as defined in the appending claims. It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A method of setting a slice level in a binary signal in presence of noise, the binary signal having a first signal level during a first signal portion and a second signal level during a second signal portion, the method comprising the steps of:
   setting the slice level initially at a level intermediate the first and the second signal level,
   providing a noise indication by measuring a first noise level during the first signal portion and by measuring a second noise level during the second signal portion wherein measuring the respective noise levels includes detecting a root mean square (RMS) level of the binary signal and includes detecting peaks in the binary signal to indicate that the noise peaks in the respective first and second portions have on average different magnitudes, and
   adjusting the slice level substantially uniformly during both the first and the second signal portions using the noise indication and as a function of an asymmetrical distribution in the first noise level and in the second noise level
   the step of adjusting the slice level includes adjusting the slice level substantially uniformly during both the first and the second signal portions.

2. A method of setting a slice level in a binary signal in the presence of noise, the binary signal having a first signal level and a first noise level during a first signal portion and a second signal level and a second noise level during a second signal portion, the method comprising:
   as a function of a root mean square (RMS) level of the binary signal, setting the slice level to a value about equal to half the difference between the magnitudes of the first and the second signal levels minus half the difference between the magnitudes of the first and the second noise levels
   wherein the first and second noise levels are determined by measuring the respective noise levels including detecting the RNMS level of the binary signal and including detecting peaks in the binary signal to determine the average magnitudes of the respective noise levels.

3. A method according to claim 1, wherein measuring the respective noise levels involves detecting peaks smaller than about 50 mV in at least one of the respective first and second portions of the binary signal.

4. A device for setting a slice level in a binary signal, having a first signal portion and a second signal portion, in the presence of noise, comprising:
   a first level shifter coupled between a pair of input terminals for receiving the binary signal and a pair of output terminals for supplying an adjusted binary signal,
   a second level shifter coupled to the pair of input terminals,
   a noise peak level detection unit includes a root mean square (RMS) level detector that detects a REMS level of the binary signal and that receives shifted input signals and produces a noise indication signal indicative of any difference in noise levels between the signal portions of the binary signal having different signal levels, the noise peak level detection unit coupled to the second level shifter, and
   an adjustment connection for feeding the noise indication signal to both the first and the second level shifters to compensate for any difference in the noise levels,
   wherein the first shifter subtracts the noise indication signal from the signal levels of the binary signal to produce the shifted input signals, and wherein the shifted input signals account for the noise peaks in the respective first and second portions having on average different magnitudes, and wherein the slice level is adjusted substantially uniformly during both the first and the second signal portions and is adjusted as a function of the RMS level and of an asymmetrical distribution in the first noise level and in the second noise level.

5. A device according to claim 4, wherein the noise peak level detection unit includes a first peak detector for detecting peaks in a first signal level of the binary signal and supplying a first peak detection signal, a second peak level detector for detecting peaks in a second signal level of the binary signal and supplying a second peak detection signal, and a differential amplifier for amplifying a difference between the first and the second peak detection signals to produce the noise indication signal.

6. A device according to claim 4, wherein the adjustment connection includes a low-pass filter for filtering the noise indication signal.

7. A device for setting a slice level in a binary signal in the presence of noise, comprising:
   a first level shifter coupled between a pair of input terminals for receiving the binary signal and a pair of output terminals for supplying an adjusted binary signal;
   a second level shifter coupled to the pair of input terminals;
   a noise peak level detection unit that receives shifted input signals and produces a noise indication signal indicative of any difference in noise levels between signal portions of the binary signal having different signal levels, the noise peak level detection unit coupled to the second level shifter; and
   an adjustment connection for feeding the noise indication signal to both the first and the second level shifters to compensate for any difference in the noise levels, wherein at least one of the first signal shifter and the second signal shifter include a series connection of a resistive element, a current source and a transistor, the base of which is coupled to receive the noise indication signal.

8. A device for setting a slice level in a binary signal in the presence of noise, comprising:
   a carriage return
   a first level shifter coupled between a pair of input terminals for receiving the binary signal and a pair of output terminals for supplying an adjusted binary signal,
   a second level shifter coupled to the pair of input terminals,
   a noise peak level detection unit that receives shifted input signals and produces a noise indication signal indicative of any difference in noise levels between signal portions of the binary signal having different signal levels, the noise peak level detection unit coupled to the second level shifter, and
   an adjustment connection for feeding the noise indication signal to both the first and the second level shifters to compensate for any difference in the noise levels,
   wherein the first shifter subtracts the noise indication signal from the signal levels of the binary signal to produce the shifted input signals, wherein the noise peak level detection unit includes a root mean square (RMS) level detector for detecting a RMS level of the binary signal, a first differential amplifier for amplifying a difference between a first level of the binary signal and the RMS level to produce a first level compensated noise signal that is supplied to a first peak detector, and a second differential amplifier for amplifying a difference between a second level of the binary signal and the RMS level to produce a second level compensated noise signal that is supplied to a second peak detector.

9. A device according to claim 8, wherein the RMS level detector includes a series connection of a transistor, a resistor and a capacitor.

10. A device for detecting a noise level in a binary signal, comprising:
   a noise peak level detection unit for receiving input signals and producing a noise indication signal, the noise peak level detection unit including a root mean square (RMS) level detector for detecting a RMS level of the binary signal, a first differential amplifier for amplifying a difference between a first level of the binary signal and the RMS level to produce a first level compensated noise signal that is supplied to a first peak detector, and a second differential amplifier for amplifying a difference between a second level of the binary signal and the RMS level to produce a second level compensated noise signal that is supplied to a second peak detector.

11. A device for setting a slice level in a binary signal in the presence of noise, the device comprising:
   a first level shifter coupled between a pair of input terminals for receiving the binary signal and a pair of output terminals for supplying an adjusted binary signal,
   a second level shifter coupled to the pair of input terminals,
   a noise peak level detection unit that receives shifted input signals and produces a noise indication signal indicative of any difference in noise levels between signal portions of the binary signal having different signal levels, the noise peak level detection unit coupled to the second level shifter, and
   an adjustment connection for feeding the noise indication signal to both the first and the second level shifters to compensate for any difference in the noise levels,
   wherein the noise peak level detection unit includes a root mean square (RMS) level detector for detecting a RMS level of the binary signal, a first differential amplifier for amplifying a difference between a first level of the binary signal and the RMS level to produce a first level compensated noise signal that is supplied to a first peak detector, and a second differential amplifier for amplifying a difference between a second level of the binary signal and the RMS level to produce a second level compensated noise signal that is supplied to a second peak detector.

12. A device according to claim 11, wherein the RMS level detector includes a series connection of a transistor, a resistor and a capacitor.

13. A device according to claim 11, wherein at least one of the first signal shifter and the second signal shifter includes a series connection of a resistive element, a transistor and a current source, the bases of the transistors being coupled to receive the noise indication signal.

14. A device according to claim 11, wherein the adjustment connection includes a low-pass filter for filtering the noise indication signal.

* * * * *

UNITED STATES PATENT AND TRADEMARK OFFICE
CERTIFICATE OF CORRECTION

| | |
|---|---|
| PATENT NO. | : 7,711,071 B2 |
| APPLICATION NO. | : 10/522470 |
| DATED | : May 4, 2010 |
| INVENTOR(S) | : Roeland John Heijna |

It is certified that error appears in the above-identified patent and that said Letters Patent is hereby corrected as shown below:

In column 5, claim 1, lines 33-35, delete "the step of adjusting the slice level includes adjusting the slice level substantially uniformly during both the first and the second signal portions".

In column 5, claim 2, line 49, delete "RNMS" and insert --RMS--.

In column 5, claim 4, line 64, delete "REMS" and insert --RMS--.

Signed and Sealed this
First Day of May, 2012

David J. Kappos
*Director of the United States Patent and Trademark Office*